United States Patent [19]

Koike

[11] Patent Number: 5,216,253
[45] Date of Patent: Jun. 1, 1993

[54] ION IMPLANTATION APPARATUS WITH VARIABLE WIDTH SLITS PROVIDING AN ION BEAM OF HIGH PURITY

[75] Inventor: Hidemi Koike, Katsuta, Japan

[73] Assignee: Hitachi, Ltd., Tokyo, Japan

[21] Appl. No.: 780,198

[22] Filed: Oct. 22, 1991

[30] Foreign Application Priority Data

Oct. 22, 1990 [JP] Japan ................................. 2-283868

[51] Int. Cl.$^5$ .................... H01J 37/317; H01J 37/145
[52] U.S. Cl. ................................. 250/492.2; 250/397; 250/398
[58] Field of Search ............... 250/492.2 R, 492.21, 250/492.23, 396 R, 397, 398, 305, 281, 423 R

[56] References Cited

U.S. PATENT DOCUMENTS

| | | | |
|---|---|---|---|
| 3,970,854 | 7/1976 | Boroffka et al. | 250/492.21 |
| 4,017,403 | 4/1977 | Freeman | 250/492.21 |
| 4,476,393 | 10/1984 | Taya et al. | 250/492.21 |
| 4,550,258 | 10/1985 | Omata et al. | 250/492.23 |
| 4,612,440 | 9/1986 | Brunnée et al. | 250/281 |
| 4,831,271 | 5/1989 | Dearnaley et al. | 250/492.21 |
| 4,839,523 | 6/1989 | Taya et al. | 250/492.21 |
| 4,851,693 | 7/1989 | Fisher | 250/492.3 |
| 4,881,010 | 11/1989 | Jetter | 250/492.21 |
| 5,025,167 | 6/1991 | Okuda et al. | 250/398 |

OTHER PUBLICATIONS

LSI Process Engineering 1982 pp. 116-119 (submitted by applicant).

*Primary Examiner*—Jack I. Berman
*Assistant Examiner*—Jim Beyer
*Attorney, Agent, or Firm*—Antonelli, Terry, Stout & Kraus

[57] ABSTRACT

In an ion implantation apparatus, a first slit for limiting an ion beam width is provided between an ion source and a mass separation electromagnet. An accelerator is provided behind the mass separation electromagnet. A second slit for separating the ion beam is provided between a deflector provided behind the accelerator and a wafer. The slit widths of the first and second slits are controlled by a controller which monitors an ion source acceleration voltage, a magnetic field intensity of the mass separation electromagnet, an accelerator voltage, and a magnetic field intensity of the deflector, and control the slit widths of the first and second slits based on the monitored information.

17 Claims, 4 Drawing Sheets

ION IMPLANTATION APPARATUS WITH VARIABLE WIDTH SLITS PROVIDING AN ION BEAM OF HIGH PURITY

FIELD OF THE INVENTION

The present invention relates to an ion implantation apparatus for making semiconductor elements of transistors or ICs.

BACKGROUND OF THE INVENTION

In a conventional ion implantation apparatus, the beam line comprises an ion source, a mass separation electromagnet, a post acceleration tube (an acceleration tube provided behind the mass separation electromagnet is defined as a post acceleration tube or a back stage accelerator), and an implantation chamber as disclosed on U.S. Pat. No. 4,672,210.

An ion implantation apparatus may be a beam scan type ion implantation apparatus which scans the ion implantation ion beam by use of a scan deflection magnet or a scan electrode, or a mechanical scan type ion implantation apparatus which carries out the ion implantation by moving the implanted side (implantation chamber) relative to the ion beam. The former is chiefly used for a small current or medium current ion implantation apparatus. The latter is used for a larger current ion implantation apparatus because it is difficult to adapt the beam scan type ion implantation apparatus for a larger current. Namely, in the large current ion implantation apparatus, when the beam is scanned concentrically on one wafer, there is a problem that an amount of heat generated is increased so that the wafer is melted. For avoiding this drawback, a batch process which treats alternatively a number of wafers in a so-called batch process type mechanical scan type ion implantation apparatus is adopted.

In a medium current ion implantation apparatus in which the implantation current is lower than approximately 1 mA, it is known to provide a beam deflection electrode ⑦, ⑧, ⑨ behind a back stage acceleration tube ⑤ as disclosed in FIG. 6.15 on page 117 of "LSI Process Engineering" (written by Mr. Masatoshi Migitaka, Published by Ohm publishing Co., Ltd., on Oct. 25, 1982).

An object of providing the beam deflection electrode is to remove a neutral beam which is generated by a collision between the ion beam and residual gas existing between the post acceleration tube and a beam scan electrode.

When doubly charged ions are implanted in wafers using the ion implantation apparatus, metastable ions are generated in the beam line between the ion source and the mass separation electromagnet. When molecule ions are implanted in wafers using the ion implantation apparatus, decomposed ions are generated in the beam line between the mass separation electromagnet and the post acceleration tube.

When the doubly charged ions which are to be implanted in the wafers are, for example, P++, the metastable ions are P+ as shown in the following chemical equation and are generated between the ion source and the mass separation electromagnet decomposing dimer ions ($P_2^+$):

$$P_2^+ \rightarrow P + P^+$$

On the other hand, when the molecule ions which are to be implanted are, for example, $BF_2^+$ (boron fluoride ions), the decomposed ions are $B^+$ or $BF^+$ in the following chemical equations and are generated between the mass separation electromagnet and the post accelerator collisions with residual gases:

$$BF_2^+ \rightarrow F_2 + B^+$$

$$BF_2^+ \rightarrow F + BF$$

When the metastable ions or the decomposed ions are implanted in the wafers together with the implanted ions, these ions having different energies are introduced to the wafers at the same time, and distribution of the implanted ions are varied within the wafers so that desired semiconductor elements are not obtained.

As mentioned above, the beam deflection electrode for removing the neutral beam is provided after the post acceleration tube in the small current ion implantation apparatus and the medium current ion implantation apparatus as a countermeasure for removing the metastable ions or the decomposed ions. However, in the large current ion implantation apparatus whose implantation current is larger than several mA, the beam deflection electrode cannot be used for the following reason.

Namely, large current ion beams have large repulsion forces between +ions in the beams and have a tendency to expand themselves. Stray electrons in the beams (secondary electrons generated by collision of the ions with the tube wall of the ion beam line become the stray electrons) act to suppress the expansion caused by electric charges of the ion beams themselves. If the beam deflection electrode is used, the stray electrons are attracted to the beam deflection electrode so that shapes of the ion beams can not be controlled.

SUMMARY OF THE INVENTION

An object of the present invention is to provide an ion implantation apparatus which is capable of maintaining purity of the implanted ions.

The present invention proposes the following means for attaining the above-mentioned object.

The first means is that the ion implantation apparatus comprises an electromagnet for mass separation of an ion beam injected from an ion source and an ion accelerator (an acceleration tube) provided behind the electromagnet, ions from the ion beam being implanted in a wafer, further comprising a deflector having a same deflection surface as a beam deflection surface (wherein the beam deflection surface is a vertical direction to a direction of a magnetic flux of the magnetic field for performing the ion beam deflection, namely, a horizontal surface to a direction in which the ion beam receives a force action by the magnetic field, if it is defined in view of Fleming's left hand law) of the mass separation electromagnet and being provided behind the accelerator, a first slit provided before the mass separation electromagnet for limiting a width of the ion beam in a direction of the beam deflection, and a second slit provided behind the deflector for separating the ion beam.

The second means for attaining the above-mentioned object is that the ion implantation apparatus further comprises adjusting means for adjusting the width of the first slit for limiting the width of the ion beam and the second slit for separating the ion beam, and a controller which monitors outputs of the ion source, the accelerator, and the deflector, calculates a most suitable width of the first and second slits based on the outputs, and outputs width control instruction signals to the adjusting means in addition to the structural elements of the first means described above.

According to the first means, as explained in the problem to be solved by the invention, in the ion implantation, for example, when the doubly charged ions are implanted to the wafers, the metastable ions are generated between the ion source and the mass separation electromagnet.

Although a charge number of metastable ion (for example, $P^+$, $B^+$) is half of that of the doubly charged ion ($P^{++}$, $B^{++}$), the orbit of the metastable ion is the same as that of the doubly charged ion within the mass separation electromagnet, since the incidence speed of the metastable ion to the mass separation electromagnet is half of that of the doubly charged ion.

Since the charge number of the doubly charged ion is different from that of the metastable ion in the post accelerator, the force received at the post accelerator owing to these ions is different from that received at the mass separation electromagnet owing to these ions. By providing the deflector having the same deflection surface as the beam deflection surface of the mass separation electromagnet, in which the deflector is provided behind the ion accelerator as shown in the present invention, the orbit of the doubly charged ion becomes different from that of the metastable ion. As a result, the doubly charged ions can be separated from the metastable ions. When the doubly charged ions and the metastable ions are separated using the deflector, the deflector can not attract the stray electrons as in the case of deflection electrodes so that the deflector can suppress the spreading of the ion beam width.

Figure 2A:
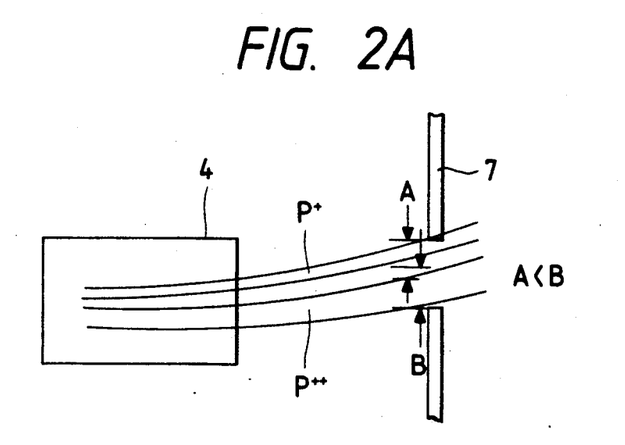
FIG. 2A illustrates a sketch for explaining operation of a beam separation slit when a dispersion distance A between a doubly charged ion beam and a metastable ion is smaller than a width B of the doubly charged ion beam.

When the deflection angle of the deflector is small (the deflection angle can not be made so large relating to the specification of the magnet), or the distance between the deflector and a wafer is short, the dispersion distance between the doubly charged ion and the metastable ion becomes smaller than each beam width. This has been a problem in that the doubly charged ion and the metastable ion are not separated perfectly. Hereunder, we will explain the problem referring to FIGS. 2A and 2B. Suppose that the width of the doubly charged ion is B, and the dispersion distance between the doubly charged ion beam and the metastable ion is A. When there is a relation of A<B as shown in FIG. 2A, even if the width of the second slit (beam separation slit, called beam eliminator 7 in the embodiment) provided behind the deflector 4 is made small, perfect separation between the metastable ion and the doubly charged ion is difficult.

Figure 2B:
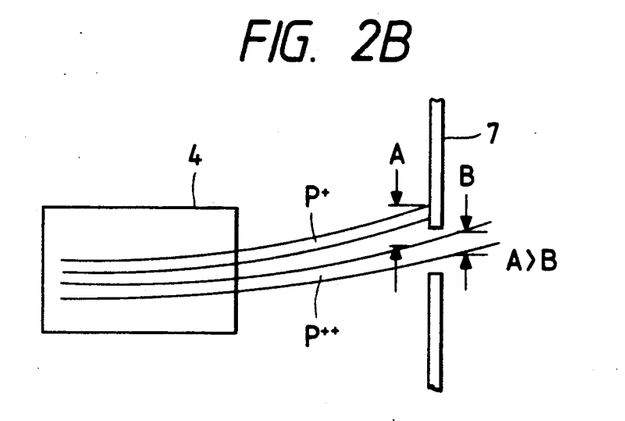
FIG. 2B illustrates a sketch for explaining operation of the beam separation slit when the dispersion distance A is larger than the width B.

On the contrary, when there is a relation of A>B as shown in FIG. 2B, the separation between the doubly charged ion and the metastable ion can be done easily using the beam separation slit 7.

The width of the doubly charged ion beam passing through the beam separation slit provided behind the deflector 4 can be controlled by providing a slit for limiting the beam width before the mass separation electromagnet. Namely, the width of the doubly charged ion beam can be limited so as to be the relation of A>B as shown in FIG. 2B by setting appropriately the slit width of the slit for limiting the beam width.

As a result, the present invention can implant only the doubly charged ions to the wafer in such a manner that the beam separation slit removes the metastable ions perfectly from the original doubly charged ion beams by providing the elements of the beam width limit slit, the deflector, and the beam separation slit.

Next, when the decomposed ions are generated at the molecule ion implantation, the decomposed ions receive acceleration again by the post acceleration together with the original molecule ions. Since the masses of the molecule ion and the deposited ion are different each other, the velocity of each ion is different after they are accelerated by the post accelerator. This is because the orbit radius of each ion is different within the deflector after the post acceleration. Accordingly, the decomposed ions are removed perfectly by the beam separation slit behind the deflector, and the molecule ions are implanted only to the wafer as well as the doubly charged ions and the metastable ions by providing the deflector, the beam width limit slit, and the beam separation slit.

Concerning the second means, it is mentioned in the embodiment, and a description thereof is omitted here.

DETAILED DESCRIPTION OF THE PREFERRED EMBODIMENTS

Figure 1:
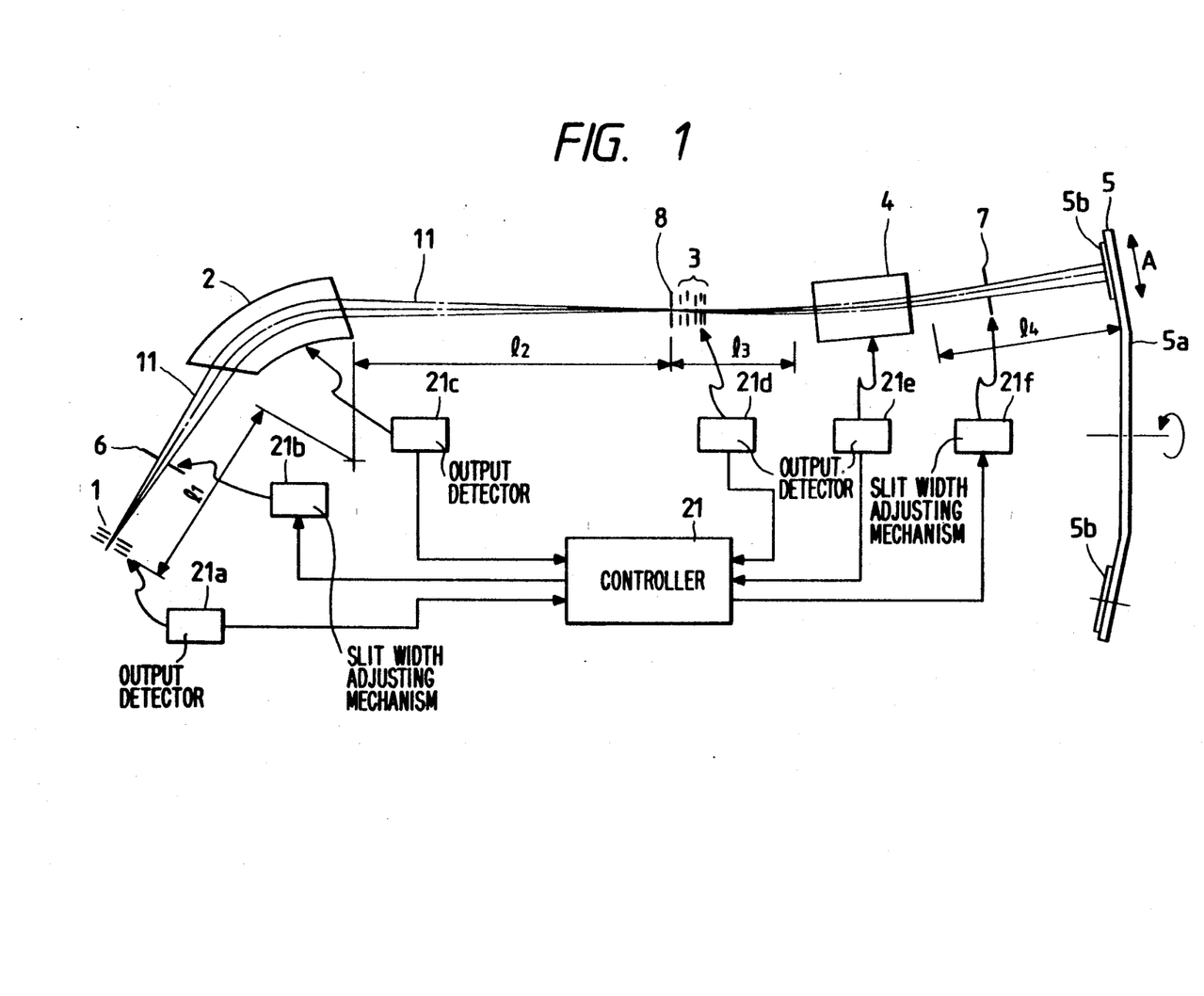
FIG. 1 illustrates a block diagram of one embodiment of a mechanical scan type large current ion implantation apparatus of the present invention.

Referring to FIG. 1, the apparatus comprises an ion source 1, a mass separation electromagnet 2, an acceleration tube 3, a deflection magnet 4 and an implanted portion 5. 11 denotes an ion beam.

The acceleration tube 3 is provided behind the mass separation electromagnet 2.

The implanted portion 5 is provided with a number of wafers 5b along the circumferential direction on a surface of a rotary disc 5a. The disc 5a reciprocates as shown by A rotating with a rotary shaft as a center thereof. The implanted portion constitutes a batch type mechanical scan ion implantation apparatus which carries out the ion implantation collectively and alternatively on a number of wafers 5b.

The deflection magnet 4 functions to separate the doubly charged ions and the metastable ions, or the molecule ions and the decomposed ions cooperating with slits 6 and 7 mentioned later. The deflection magnet 4 is provided between the acceleration tube 3 and the implanted portion (the wafers 5b on the rotational disc 5a). The deflection magnet 4 has the same deflection surface or plane as the deflection surface or plane of the mass separation electromagnet 2 (in the embodiment, these deflection surfaces or planes are the same as the surface which is parallel to the paper surface of FIG. 1).

The slit 6 is provided between the ion source 1 and the mass separation electromagnet 2 to function as a beam limiter for limiting the beam width (hereafter, the slit 6 is referred to as the beam limiter).

The slit 7 is provided behind the deflection magnet 4 to function as a beam separation slit (hereafter, referred to as a beam eliminator).

The beam limiter 6 and the beam eliminator 7 have mechanisms 21b and 21f, respectively, for adjusting each slit width automatically. A controller 21 calculates the most preferable slit widths of the beam limiter 6 and the beam eliminator 7 by a method mentioned later based on monitor signals from an output detector 21a of the ion source 1, an output detector 21c of the mass separation electromagnet 2, an output detector 21d of the acceleration tube 4 and an output detector 21e of the deflection magnet 4, and outputs the calculated signals of the slit widths to the slit width adjusting mechanisms 21b and 21f. 8 denotes a mass separation slit provided before the acceleration tube 3.

Figure 3:
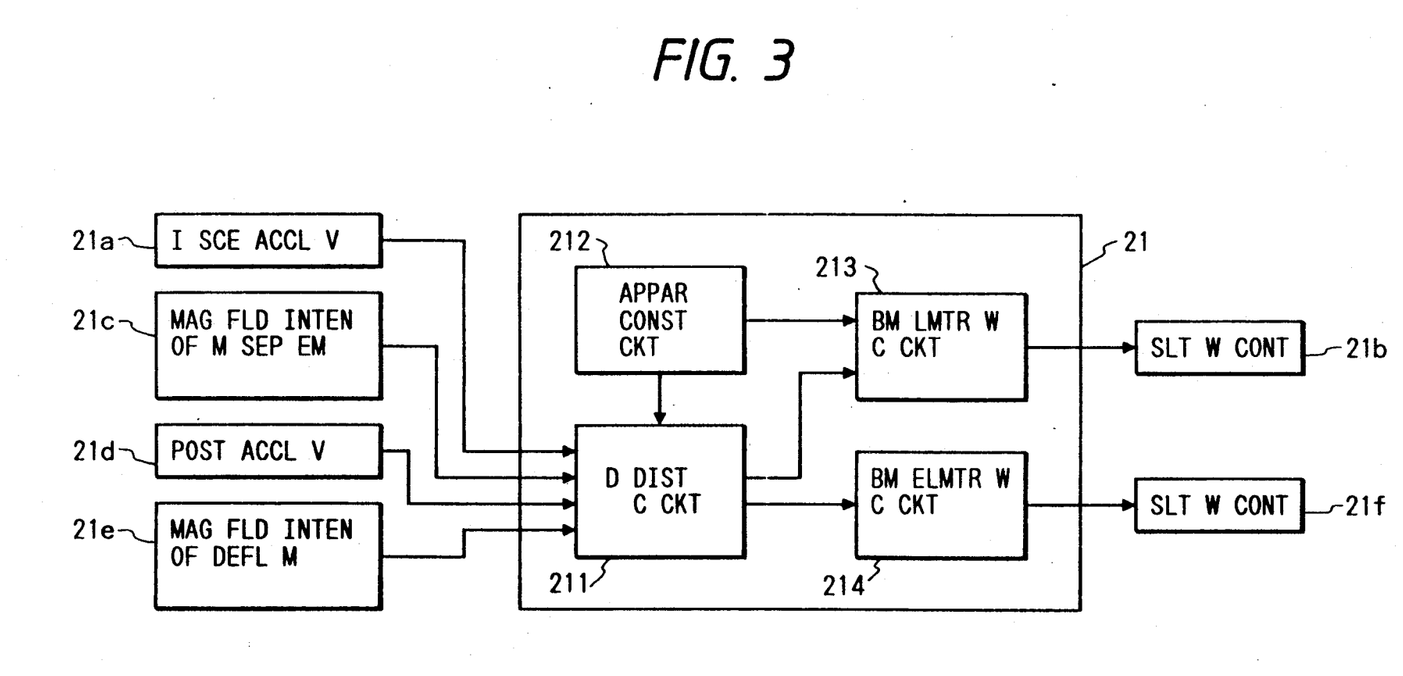
FIG. 3 illustrates a block diagram of a controller shown in FIG. 1.

Referring to FIG. 3, the controller 21 comprises a dispersion distance calculation circuit 211, an apparatus constant circuit 212, a beam limiter width calculation circuit 213 and a beam eliminator width calculation circuit 214.

An ion source acceleration voltage $V_I$ from the detector 21a, a magnetic field intensity of the mass separation electromagnet $B_A$ from the detector 21c, a post acceleration voltage $V_p$ from the detector 21d and a magnetic field intensity of the deflection magnet $B_D$ from the detector 21e are inputted to the dispersion distance calculation circuit 211.

The apparatus constant circuit 212 stores the constants which are decided by the constitution of the ion optics system from the ion source 1 to the ion implanted portion 5. The constants of the ion optics system comprise a deflection radius $R_A$ of the mass separation electromagnet, a standard deflection radius $R_D$ of the deflection magnet, a standard reflection angle $\alpha$ of the deflection magnet, constants $A_L$ and $C_L$ at the beam limiter, constants $A_E$ and $C_E$ at the beam eliminator and an ion injection position $S_O$ of the ion source (injection position from the beam center at the direction of the beam deflection surface).

The dispersion distance calculation circuit 211 receives the magnetic field deflection radiuses $R_A$ and $R_D$ and the deflection magnet deflection angle $\alpha$ from the apparatus constant circuit 212.

The dispersion distance calculation circuit 211 performs calculations according to the following formulae (1), (2) and (3) for obtaining the dispersion distance.

$$\frac{M}{Z} = \frac{V_I}{\left(\frac{144}{(B_A \cdot R_A)}\right)^2} \tag{1}$$

where,
M ... mass number of ion
Z ... charge number of ion
From M/Z of the implanted ion, $$\cdot \frac{\dot{M}}{Z}$$

of the metastable or the decomposed ion can be obtained from data stored in a memory in the dispersion distance calculation circuit 211.

Next a deflection radius $\dot{R}_D$ of the decomposed ion can be obtained by the following formula.

$$\dot{R}_D = \frac{144}{B_D} \sqrt{\frac{\dot{M}}{Z}(V_I + V_P)} \tag{2}$$

A deflection angle $\beta$ of the mass separation electromagnet is as follows:

$$\beta = \sin^{-1}\frac{R_D \sin\alpha}{\dot{R}_D} \tag{3}$$

The ion beam advances directly after the ion beam injected from the deflection magnet. The beam eliminator width D, or the dispersion distance, can be obtained from a memory storing data relating the team limiter width D corresponding to the deflection angle $\beta$.

A beam eliminator control circuit 21f is controlled based on the beam eliminator width D through the beam eliminator width calculation circuit 214.

The beam limiter width calculation circuit receives the beam eliminator width D from the dispersion distance calculation circuit 211 and the constants $A_L$, $C_L$, $A_E$ and $C_E$ from the apparatus constant circuit 212.

The beam limiter width calculation circuit 213 performs calculations according to the following formulae (4) and (5) for obtaining the beam width of the beam limiter.

At first, an allowance value $\gamma$ for lowering the beam width of the beam eliminator is as follows:

$$\gamma = (D - A_E \cdot S_O)/C_E \tag{4}$$

Next, the beam width S at the beam limiter position of the ion injected from the ion source at the allowance value $\gamma$ is as follows:

$$S = A_L \cdot S_O + C_L \cdot \gamma \tag{5}$$

In the embodiment, fundamental measures of each construction element are as follows:

ion source 1 ... deflection direction ion injection width: 2 mm, maximum acceleration voltage : 30 KV, mass separation electromagnet 2 ... deflection radius : 400 mm, deflection angle : 60 degree, post acceleration tube 3 ... maximum acceleration voltage : 220 KV, deflection magnet 4 ... deflection radius : 1893 mm, deflection angle : 10 degree, implanted portion 5 ... deflection direction beam width : 50 mm, beam limiter 6 ... deflection direction beam limiter width : 0–25 mm, beam eliminator 7 ... deflection direction eliminator width : 10–50 mm, mass separation slit 8 ... deflection direction slit width : 5 mm, each distance ... $l_1 = 500$ mm, $l_2 = 800$ mm, $l_3 = 300$ mm, $l_4 = 450$ mm.

where,
$l_1$ = distance from the ion source injection portion to the incident portion of the mass separation electromagnet,
$l_2$ = distance from the injected portion of the mass separation electromagnet to the mass separation slit,
$l_3$ = distance from the mass separation slit to the incident portion of the deflection magnet, and $l_4$ = distance from the injection portion of the deflection magnet to the wafer.

In the embodiment, ions are extracted from the ion source 1 at an acceleration of $V_1$KV, the post acceleration tube carries out an acceleration of $V_2$KV, and the dispersion distance of the metastable ions ($B_2^+ \rightarrow B + B^+$) or the decomposed ions ($BF_2^+ \rightarrow F_2 + B$) at the implanted portion 5, for example, when the doubly charged ions ($B^{++}$) or the molecule ions ($BF_2^+$) are implanted by the total acceleration of $(V_1 + V_2)$KV is as follows:

(1) dispersion distance (D) between the $B^{++}$ ion and the metastable ion ($B^+$)

| $V_1$ (KV) | $V_2$ (KV) | $V_1 + V_2$ | D (mm) |
|---|---|---|---|
| 30 | 90 | 120 | 15.7 |
| 30 | 120 | 150 | 16.4 |
| 30 | 150 | 180 | 16.8 |
| 30 | 180 | 210 | 17.1 |
| 30 | 210 | 240 | 17.3 |

(2) distance between the $BF_2^+$ ion and the decomposited ion ($B^+$)

| $V_1$ (KV) | $V_2$ (KV) | $V_1 + V_2$ | D (mm) |
|---|---|---|---|
| 30 | 90 | 120 | 22.4 |
| 30 | 60 | 90 | 24.3 |
| 30 | 30 | 60 | 27.5 |
| 30 | 0 | 30 | 41.7 |
| 10 | 0 | 10 | 41.7 |

As mentioned above, the dispersion distance D at the implanted portion 5 is smaller than the original beam width 50 mm at the implanted portion (refer to the fundamental measures). For separating these ion beams, it is necessary that the separation width (dispersion width) A have the relation of A > B to the original beam width B as mentioned before relating to FIGS. 2A and 2B.

For establishing the above-mentioned relationship, the beam limiter 6 and the beam eliminator 7 are used. The width of the beam limiter 6 is controlled in such a manner that the beam width of the original ion beam (the doubly charged ions or the molecule ions) is smaller than the above-mentioned dispersion distance (D) at the implanted portion 5. Further, the slit width of the beam eliminator 7 is controlled to be smaller than the dispersion distance.

The doubly charged ions and the metastable ions, or the molecule ions and the decomposed ions are capable of separation by using the beam limiter 6 and the beam eliminator 7 other than the deflection magnet 4, even if the deflection angle of the deflection magnet 4 is small (10 degree in the embodiment).

The above-mentioned dispersion distance can be obtained from the ion source 1, the acceleration voltage of the post acceleration tube 3 and the implanted ion species. Accordingly, the beam purity can be maintained automatically by monitoring the real outputs of the detectors 21a, 21c, 21d, and controlling appropriately the slit widths of the beam limiter 6 and the beam eliminator 7 using the controller 21 and the slit width adjusting mechanisms 21b and 21f.

The embodiment can suppress the lowering of the ion current while maintaining the purity of the implanted ions and prevent the lowering of the processing capacity of the implantation by controlling the beam limiter 6 and the beam eliminator 7 in accordance with the beam extracting conditions.

The embodiment can maintain the purity of the implantation current without making the distance $l_4$ between the deflection magnet 4 and the implanted portion 5 large and make the size of the apparatus small by applying the beam limiter 6 and the beam eliminator 7 to the apparatus.

Figure 4:
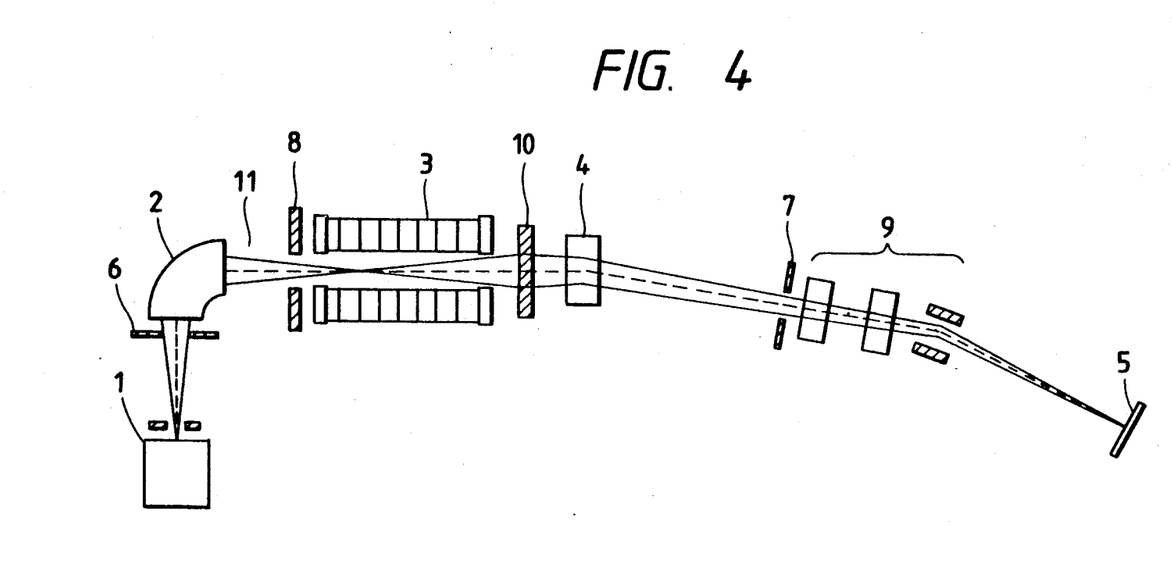
FIG. 4 illustrates a block diagram of one embodiment of a beam scan type ion implantation apparatus of the present invention.

Referring to FIG. 4, the same parts as in FIG. 1 are indicated by the same symbols. Although the controller 21, the detectors 21a, 21c, 21d and 21e and the slit adjusting mechanisms 21b and 21f are omitted in FIG. 4, these devices are applied to the ion implantation apparatus shown in FIG. 4 as well as in the case of FIGS. 1, 2 and 3. The ion beam width limit slit 6 is provided between the ion source 1 and the mass separation electromagnet 2. An electrostatic deflector 4 and the ion beam separation slit 7 are provided between the acceleration tube 3 and a scan electrode 9. The scan electrode 9 comprises two scan electrodes provided behind the beam separation slit 7 and an electrostatic type deflection electrode for removing the neutral beam. Quadrangular pole electrode lenses are used for focusing the beam on the wafer 5. The apparatus shown by FIG. 4 can attain the same effects as that of FIGS. 1, 2 and 3.

According to the first method of the present invention, it is capable of separating perfectly the metastable ions in the doubly charged ions implantation or the decomposed ions in the molecule ion implantation from the original beam line without injuring the shape control of the ion beam so that it can maintain the purity of the implanted ions, even if it is the apparatus adopting the mechanical scan type apparatus such as the large current ion implantation apparatus or the beam scan type apparatus such as the small or medium current ion implantation apparatus.

According to the second method of the present invention, the slit widths of the beam width limit slit and the beam separation slit are automatically controlled based on the ion beam conditions detecting the output status of the ion source, the accelerator and the deflector so that it can maintain automatically the purity of the implanted ions corresponding to the ion beam conditions.

What we claim is:

1. An ion implantation apparatus comprising:
   an ion source for producing an ion beam;
   a first slit having an adjustable width for limiting a width of the ion beam from the ion source in a predetermined plane;
   a mass separation electromagnet for deflecting the width-limited ion beam from the first slit in the predetermined plane to perform mass separation of the width-limited ion beam;
   an ion accelerator for accelerating the mass-separated ion beam from the mass separation electromagnet;
   a detector for deflecting the accelerated ion beam in a predetermined plane to separate the accelerated ion beam into a desired ion beam and an undesired ion beam;
   a second slit having an adjustable width for passing the desired ion beam from the deflector and blocking the undesired ion beam from the deflector; and
   means for holding a wafer in a path of the desired ion beam passed by the second slit such that the desired ion beam passed by the second slit is implanted into the wafer.

2. An ion implantation apparatus according to claim 1, further comprising means for adjusting the widths of the first slit and the second slit to achieve a desired degree of purity of the desired ion beam passed by the second slit based on characteristics of the ion source, the mass separation electromagnet, the ion accelerator, and the deflector.

3. An ion implantation apparatus according to claim 2, wherein the characteristics are an accelerating voltage of the ion source, a magnetic field intensity of the mass separation electromagnet, an accelerating voltage of the ion accelerator, and a deflection field intensity of the deflector.

4. An ion implantation apparatus according to claim 2, wherein the deflector includes a deflection magnet producing a uniform magnetic field.

5. An ion implantation apparatus according to claim 4, wherein the wafer holding means includes a rotary disc for holding the wafer and means for rotating the rotary disc such that the wafer mechanically moves relative to the desired ion beam passed by the second slit, thereby providing a mechanical scan type ion implantation apparatus.

6. An ion implantation apparatus according to claim 2, wherein the deflector includes an electrostatic deflector.

7. An ion implantation apparatus according to claim 6, further comprising means for scanning the desired ion beam passed by the second slit across a surface of the wafer, thereby providing a beam scan type ion implantation apparatus.

8. An ion implantation apparatus according to claim 2, wherein the wafer holding means includes a rotary disc for holding the wafer and means for rotating the rotary disc such that the wafer mechanically moves relative to the desired ion beam passed by the second slit, thereby providing a mechanical scan type ion implantation apparatus.

9. An ion implantation apparatus according to claim 2, further comprising means for scanning the desired ion beam passed by the second slit across a surface of the wafer, thereby providing a beam scan type ion implantation apparatus.

10. An ion implantation apparatus according to claim 1, wherein the deflector includes a deflection magnet producing a uniform magnetic field.

11. An ion implantation apparatus according to claim 10, wherein the wafer holding means includes a rotary disc for holding the wafer and means for rotating the rotary disc such that the wafer mechanically moves relative to the desired ion beam passed by the second slit, thereby providing a mechanical scan type ion implantation apparatus.

12. An ion implantation apparatus according to claim 1, wherein the deflector includes an electrostatic deflector.

13. An ion implantation apparatus according to claim 12, further comprising means for scanning the desired ion beam passed by the second slit across a surface of the wafer, thereby providing a beam scan type ion implantation apparatus.

14. An ion implantation apparatus according to claim 1, wherein the wafer holding means includes a rotary disc for holding the wafer and means for rotating the rotary disc such that the wafer mechanically moves relative to the desired ion beam passed by the second slit, thereby providing a mechanical scan type ion implantation apparatus.

15. An ion implantation apparatus according to claim 1, further comprising means for scanning the desired ion beam passed by the second slit across a surface of the wafer, thereby providing a beam scan type ion implantation apparatus.

16. An ion implantation apparatus comprising:
an ion source for producing an ion beam;
a first slit having an adjustable width for limiting a width of the ion beam from the ion source in a predetermined plane;
a mass separation electromagnet for deflecting the width-limited ion beam from the first slit in the predetermined plane to perform mass separation of the width-limited ion beam;
an ion accelerator for accelerating the mass-separated ion beam from the mass separation electromagnet;
a deflection magnet producing a uniform magnetic field for deflecting the accelerated ion beam in the predetermined plane to separate the accelerated ion beam into a desired ion beam and an undesired ion beam;
a second slit having an adjustable width for passing the desired ion beam from the deflection magnet and blocking the undesired ion beam from the deflection magnet;
slit width adjusting means for adjusting the widths of the first slit and the second slit;
control means for detecting an accelerating voltage of the ion source, a magnetic field intensity of the mass separation electromagnet, an accelerating voltage of the ion accelerator, and a magnetic field intensity of the deflection magnet, determining optimum widths of the first slit and the second slit for obtaining a desired degree of purity of the desired ion beam passed by the second slit based on the detected accelerating voltages and magnetic field intensities, and controlling the slit width adjusting means to adjust the widths of the first slit and the second slit to the optimum widths;
a rotary disc holding a plurality of wafers disposed such that the wafers pass through a path of the desired ion beam passed by the second slit when the rotary disc is rotated such that the desired ion beam passed by the second slit is implanted into the wafers; and
means for rotating the rotary disc such that the wafers are mechanically moved relative to the desired ion beam passed by the second slit, thereby providing a mechanical scan type ion implantation apparatus.

17. An ion implantation apparatus comprising:
an ion source for producing an ion beam;
a first slit having an adjustable width for limiting a width of the ion beam form the ion source in a predetermined plane;
a mass separation electromagnet for deflecting the width-limiting ion beam from the first slit in the predetermined plane to perform mass separation of the width-limited ion beam;
an ion accelerator for accelerating the mass-separated ion beam from the mass separation electromagnet;
an electrostatic deflector for deflecting the accelerated ion beam in the predetermined plane to separate the accelerated ion beam into a desired ion beam and an undesired ion beam;
a second slit having an adjustable width for passing the desired ion beam from the electrostatic deflector and blocking the undesired ion beam from the electrostatic deflector;

slit width adjusting means for adjusting the widths of the first slit and the second slit;

control means for detecting an accelerating voltage of the ion source, a magnetic field intensity of the mass separation electromagnet, an accelerating voltage of the ion accelerator, and an electric field intensity of the deflection magnet, determining optimum widths of the first slit and the second slit for obtaining a desired degree of purity of the desired ion beam passed by the second slit based on the detected accelerating voltages, magnetic field intensity, and electric field intensity, and controlling the slit width adjusting means to adjust the widths of the first slit and the second slit to the optimum widths;

means for holding a wafer in a path of the desired ion beam passed by the second slit such that the desired ion beam passed by the second slit is implanted into the wafer; and means for scanning the desired ion beam passed by the second slit across a surface of the water, thereby providing a beam scan type ion implantation apparatus.

* * * * *